United States Patent [19]
Hirayama

[11] Patent Number: 6,015,725
[45] Date of Patent: Jan. 18, 2000

[54] VERTICAL FIELD EFFECT TRANSISTOR AND MANUFACTURING METHOD THEREOF

[75] Inventor: Teruo Hirayama, Kanagawa, Japan

[73] Assignee: Sony Corporation, Tokyo, Japan

[21] Appl. No.: 08/914,096

[22] Filed: Aug. 19, 1997

[30] Foreign Application Priority Data

Aug. 22, 1996 [JP] Japan .................................... 8-221436

[51] Int. Cl.[7] .............................................. H01L 21/8232
[52] U.S. Cl. ......................... 438/156; 438/138; 438/192
[58] Field of Search .................................. 438/138, 156, 438/192, 268, 270

[56] References Cited

U.S. PATENT DOCUMENTS

| | | | |
|---|---|---|---|
| 4,881,105 | 11/1989 | Davari et al. ............................ | 357/23.4 |
| 5,380,670 | 1/1995 | Hagino ....................................... | 437/31 |
| 5,424,231 | 6/1995 | Yang .......................................... | 437/40 |

*Primary Examiner*—Charles Bowers
*Assistant Examiner*—Martin Sulsky
*Attorney, Agent, or Firm*—Hill & Simpson

[57] ABSTRACT

A vertical field effect transistor (1) and a method of manufacturing thereof are disclosed, in which a buried layer (3) of a conduction type opposite to that of a substrate (2) is formed to a predetermined depth in the substrate (2) by ion implantation. The bottom of recess (2a) for forming a protrusion (2b) on the substrate (2) is located within the corresponding one of the buried layer (3). The width of the recess (2a) is set smaller than the width of the buried layer (3). The surface of the protrusion (2b) and the bottom of the recess (2a) are formed with impurities regions (4a, 4b; 5a, 5b) constituting a source and a drain, respectively. A channel length (L) of the channel region formed on the side wall of the protrusion (2b) is defined by the distance between the buried layer (3) and the impurities regions (5a, 5b) on the surface of the protrusion (2b).

3 Claims, 12 Drawing Sheets

VERTICAL FIELD EFFECT TRANSISTOR AND MANUFACTURING METHOD THEREOF

BACKGROUND OF THE INVENTION

The present invention relates to a vertical field effect transistor having a protrusion formed on a substrate, wherein the side wall of the protrusion is used as a channel region and to a method for manufacturing the transistor.

In recent years, a semiconductor device constituting a MOS transistor has been widely studied in which a groove is formed on a silicon substrate and the side walls of the groove are used as a channel region in order to improve the scale of integration of the semiconductor device.

A configuration of such a semiconductor device, i.e., what is called a vertical MOS transistor, is shown in FIG. 1. This vertical MOS transistor 41 comprises a semiconductor substrate 42 made of a p-type silicon formed with a groove which forms a recess 42a and a protrusion 42b on the semiconductor substrate 42.

On the surface of the recess 42a of the semiconductor substrate 42 there are formed, from the surface side down, an n-type high-concentration region (n+) 43a and an n-type low-concentration region (n−) 43b. Both the regions 43a and 43b make up an n-type source region 43. On the surface of the protrusion 42b of the substrate 42 there are formed, from the surface side down, an n-type high-concentration region (n+) 44a and an n-type low-concentration region (n−) 44b. Both the regions 44a and 44b constitute an n-type drain region 44.

A gate insulating film 45 made of an oxide film or the like is formed on the semiconductor substrate 42.

On each side wall of the protrusion 42b of the semiconductor substrate 42 there is formed with a gate electrode 46 made of polysilicon or the like through the gate insulating film 45.

An inter-layer insulating layer 47 is formed over the entire surface of the elements mentioned above, and an opening is formed through the inter-layer insulating layer 47 and the gate insulating film 45 above the high-concentration region 44a of each drain region 44. A plug contact 48 made of tungsten or the like, for example, is formed in each opening.

Further, a metal wire 49 made of Al or the like is formed on each plug contact 48 to lead an electrode from the drain region 44.

In this vertical MOS transistor 41 of a LDD (lightly doped drain) type, a channel region is formed in the side wall portion of the protrusion 42b opposing to the gate electrode 46 through the gate insulating film 45, i.e., between the source region 43 and the drain region 44.

With the configuration of FIG. 1, a distance between the drain region 44 and the source region 43, i.e., a channel length (gate length) L is determined by the depth of the groove formed on the semiconductor substrate 42. However, if the depth of the groove is scattered from one groove to another, the channel length L is scattered and hence the characteristic of the MOS transistor is also varied, thereby making it impossible to secure stable characteristics of a semiconductor device as a whole.

The depth of the groove develops some degree of variations during the manufacturing process, sometimes resulting in unstable characteristics.

SUMMARY OF THE INVENTION

In order to obviate the above-mentioned problem, an object of the present invention is to provide a vertical field effect transistor and a manufacturing method, in which stable characteristics can be obtained by eliminating the variations in the channel length.

According to an aspect of the present invention, there is provided a vertical field effect transistor comprising a substrate, a buried layer formed to a predetermined depth of the substrate by ion implantation and having a conduction type opposite to that of the substrate, a protrusion formed on the substrate, a recess having the bottom thereof arranged within the buried layer for forming the protrusion on the substrate and having a width smaller than that of the buried layer, an impurity region constituting a source and a drain respectively formed on the surface of the protrusion and the bottom surface of the recess, and a channel region formed on the side wall of the protrusion and having a channel length defined between the buried layer and the impurity region on the surface of the protrusion.

With this configuration, the buried layer is uniquely determined by the flying distance of ion implantation and formed to a predetermined depth.

The recess is formed by the groove in such a manner as to reach the buried layer. In other words, the recess is formed with the bottom portion thereof set smaller than the width of the buried layer. The impurity region constituting the source and the drain is formed on the bottom surface of the recess and the surface of the protrusion, with the channel length on the side wall of the protrusion being defined between the buried layer and the impurity region on the surface of the protrusion. Even when the depth of the recess is varied, therefore, the channel length remains unchanged.

Consequently, it is possible to manufacture a vertical field effect transistor of stable characteristics free of variations in channel length.

According to another aspect of the invention, there is provided a method of manufacturing a vertical field effect transistor, comprising the steps of forming a buried layer of a second conduction type by ion implantation to a predetermined depth of a semiconductor substrate of a first conduction type, forming on the surface a recess having a width smaller than that of the buried layer and its bottom surface arranged in the buried layer, forming a gate electrode through a gate insulating film on the side wall of a protrusion formed by the recess of the semiconductor substrate, and forming an impurity region constituting a source and a drain on the surface of the protrusion and the bottom surface of the recess on the semiconductor substrate.

According to this manufacturing method, the flying distance of ion implantation, i.e., the depth of the buried layer, is defined by a condition of the ion implantation. Accordingly, the buried layers having a substantially predetermined depth can be formed.

Also, when the recess is formed by the groove on the substrate, the bottom portion of the recess is arranged within the buried layer and the width of the recess is set smaller than the width of the buried layer. Therefore, even when the depth of the groove is varied somewhat, the bottom portion of the groove is formed in the buried layer, and the length of the channel is defined between the buried layer formed to a substantially predetermined depth and the impurity region (drain region or source region) formed on the surface of the protrusion of the substrate and is maintained substantially constant.

DESCRIPTION OF THE PREFERRED EMBODIMENTS

According to the present invention, there is provided a vertical field effect transistor comprising a substrate, a protrusion formed on the substrate, and a channel region formed as the side wall of the protrusion, in which a buried layer of a conduction type opposite to that of the substrate is formed to a predetermined depth on the substrate by ion implantation, a recess for forming the protrusions has its bottom surface arranged within the buried layer and its width smaller than that the buried layer, its an impurity region constituting a source and a drain is formed on the surface of the protrusion and on the bottom surface of the recess, and the length of a channel regions is defined between the buried layer and the impurity region on the surface of the protrusion.

According to the present invention, there is also provided a method of manufacturing a vertical field effect transistor comprising the steps of forming a buried layer of a second conduction type by ion implantation to a predetermined depth of a semiconductor substrate of a first conduction type, forming on the substrate a recess with its bottom surface located in the buried layer and having a width smaller than that of the buried layer, forming a gate electrode on the side wall of the protrusion formed by the recess through a gate insulating film, and forming a impurity region constituting a source and a drain, respectively, on the surface of the protrusion and on the bottom surface of the recess.

Also, in the method of manufacturing a vertical field effect transistor described above, the buried layer is a layer thermally diffused after ion implantation.

Further, in the method of manufacturing a vertical field effect transistor described above, the buried layer is formed by ion implantation using a mask formed on an insulating film, a side wall insulating film is formed on the insulating film patterned by the mask, and then the recess is formed using the insulating layer and the side wall insulating film as a mask.

Now, embodiments of the vertical field effect transistor and the method of manufacturing the same according to the invention will be described with reference to the accompanying drawings.

Figure 2:
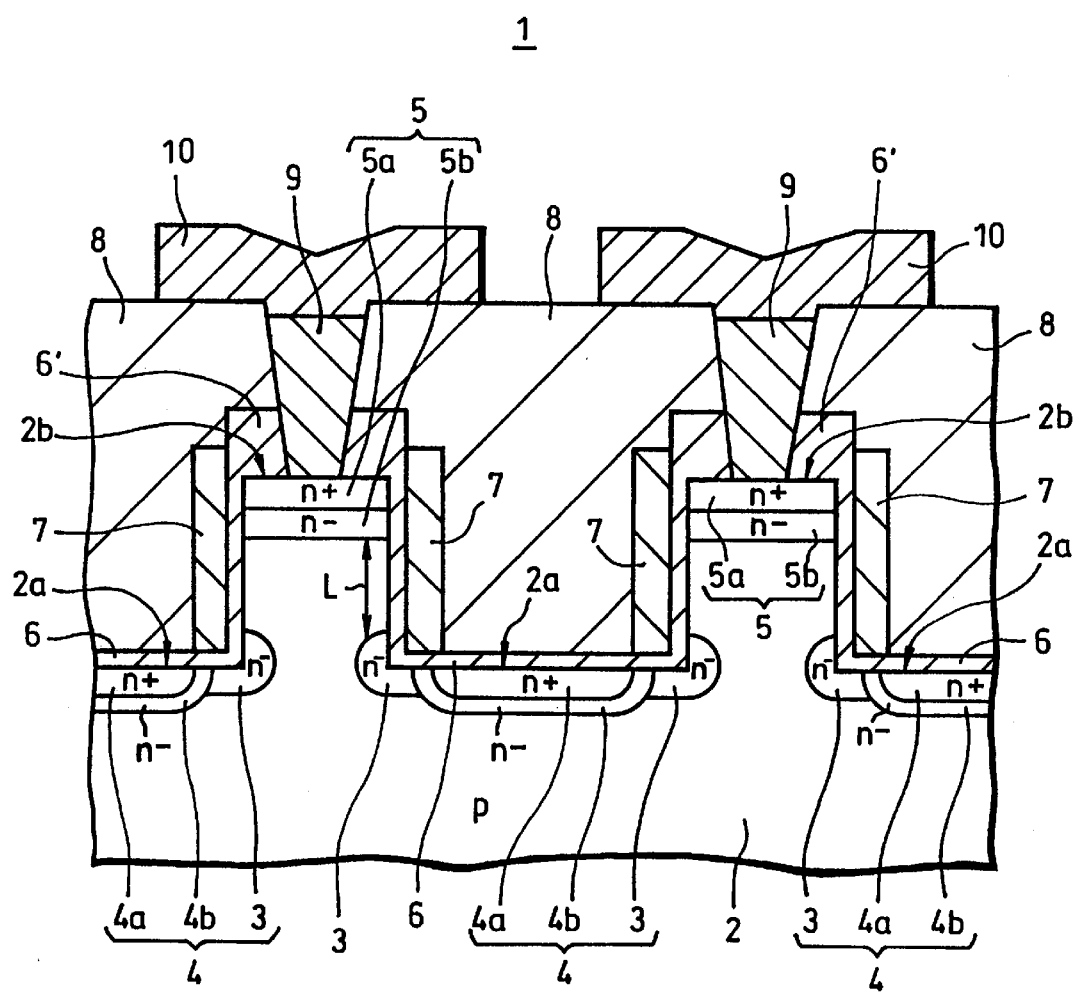
FIG. 2 is a cross sectional view schematically showing a configuration of a vertical field effect transistor (vertical MOS transistor) according to an embodiment of the present invention.

FIG. 2 shows an example of the vertical field effect MOS transistor according to the present invention. A vertical field effect MOS transistor 1 has a semiconductor substrate 2 made of silicon of a first conduction type, i.e., a p-type on which a groove is formed. The groove makes up a recess 2a and a protrusion 2b on the semiconductor substrate 2.

A low-concentration (n–) buried layer 3 of a second conduction type, i.e., an n-type in the present example, is formed around a periphery of the recess 2a, i.e., on the outer and lower sides of the bottom portion of the recess 2a. Accordingly, the bottom of the recess 2a is arranged within the n-type low-concentration buried layer 3, and the recess 2a is set to a width smaller than the width of the buried layer 3. To this end, the buried layer 3 is formed by thermal diffusion after ion implantation.

Also, on the surface of the recess 2a of the semiconductor substrate 2 there are formed from its surface side down, an n-type high-concentration region (n+) 4a and an n-type low-concentration region (n–) 4b. The high-concentration region 4a, the low-concentration region 4b and the buried layer 3 make up an n-type source region 4. On the surface of the protrusion 2b of the semiconductor substrate 2 there are formed, from its surface side down, an n-type high-concentration region (n+) 5a and an n-type low-concentration region (n–) 5b. Both the regions 5a and 5b constitute an n-type drain region 5.

A gate insulating film 6 made of an oxide or the like is formed on the semiconductor substrate 2. The gate insulating film 6 has a portion 6' above the high-concentration region 5a of the drain region 5, which portion 6' is formed thicker than the other portion thereof.

The side wall of the protrusion 2b of the semiconductor substrate 2 is formed with a gate electrode 7 made of polysilicon or the like through the gate insulating film 6.

An inter-layer insulating layer 8 is formed to cover all the elements mentioned above. An opening is formed through the portion of the inter-layer insulating layer 8 and the gate insulating film 6' on the high-concentration region 5a of the drain region 5. A plug contact 9 made of tungsten or the like, for example, is formed in the opening.

Further, a metal wire 10 made of Al or the like is formed on the plug contact 9 to thereby derive an electrode from the drain region 5.

In this vertical MOS transistor 1, a channel region is formed between the drain region 5 and the buried layer 3 making up a part of the source region 4, i.e., on the side wall of the protrusion 2b of the semiconductor substrate 2.

A channel length L of the channel region is a distance between the buried layer 3 and the drain region 5.

Even in the case where the groove is varied in depth somewhat, therefore, the distance between the buried layer 3 and the drain region 5 remains unchanged in the bottom of the groove, i.e., the bottom of the recess 2a of the semiconductor substrate 2 is located within the buried layer 3. Thus the channel length L is not affected by any variations in the groove depth.

Figure 1:
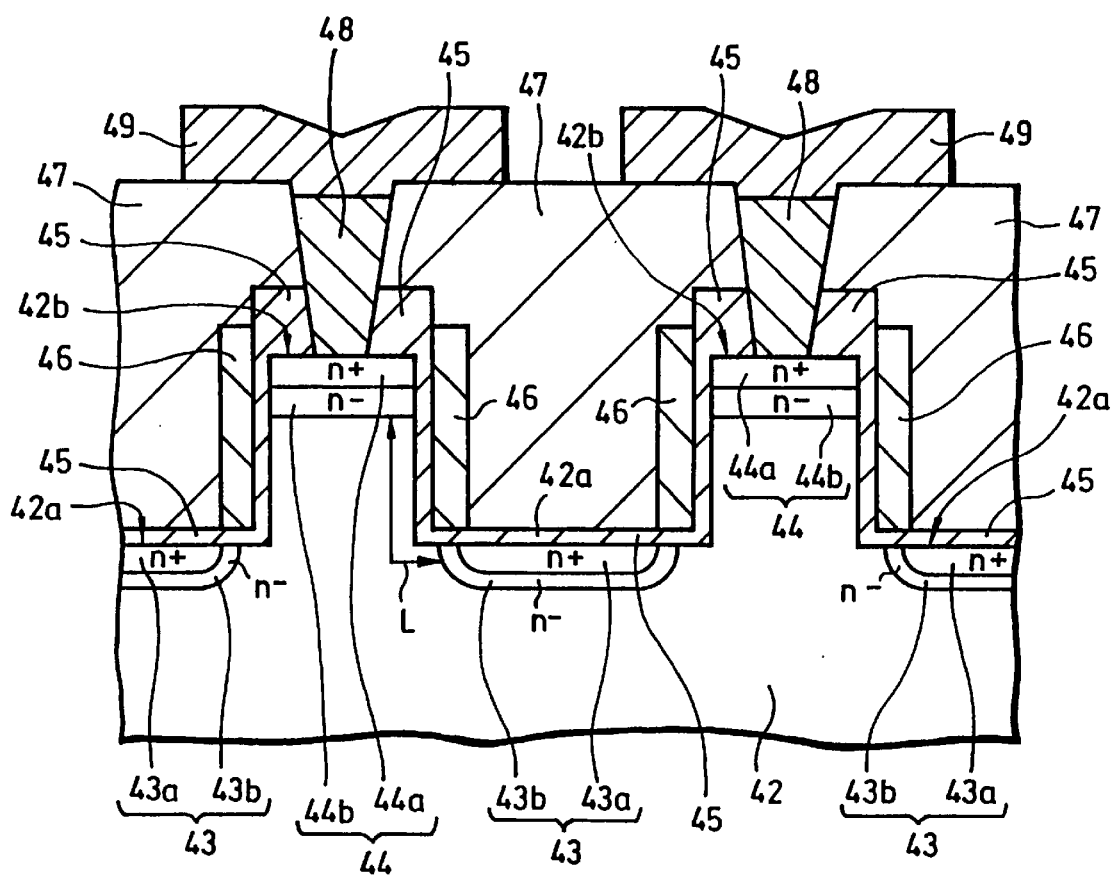
FIG. 1 is a cross sectional view schematically showing a configuration of a conventional vertical MOS transistor.

Therefore, the channel length L is free of variations unlike the case of FIG. 1, thus eliminating the characteristics variations among the vertical MOS transistors, so that a semiconductor device using such a vertical MOS transistor has stable characteristics.

The vertical MOS transistor 1 is manufactured in the manner described below.

Figure 3A:
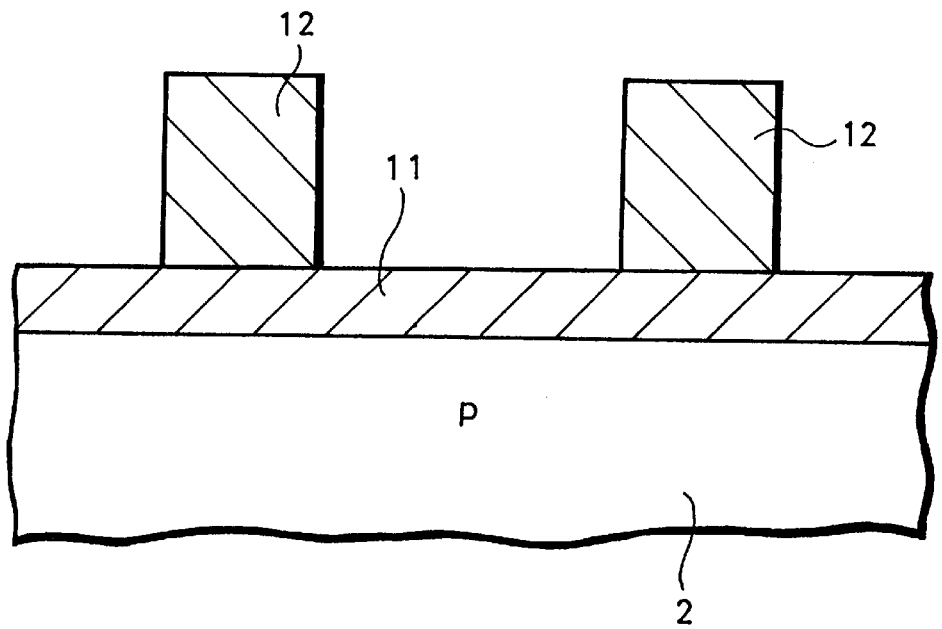
FIGS. 3A to 3J are cross sectional views used to explain the process steps for manufacturing the vertical MOS transistor shown in FIG. 2.

First, as shown in FIG. 3A, a semiconductor substrate 2 made of silicon, for example, and having a first conductivity type, i.e., a p-type is formed thereon with an insulating film 11 by a thermal oxidation or a CVD (chemical vapor deposition) method. A photoresist 12 is formed on the insulating film 11 so as to open a portion where a groove is formed later.

Figure 3B:
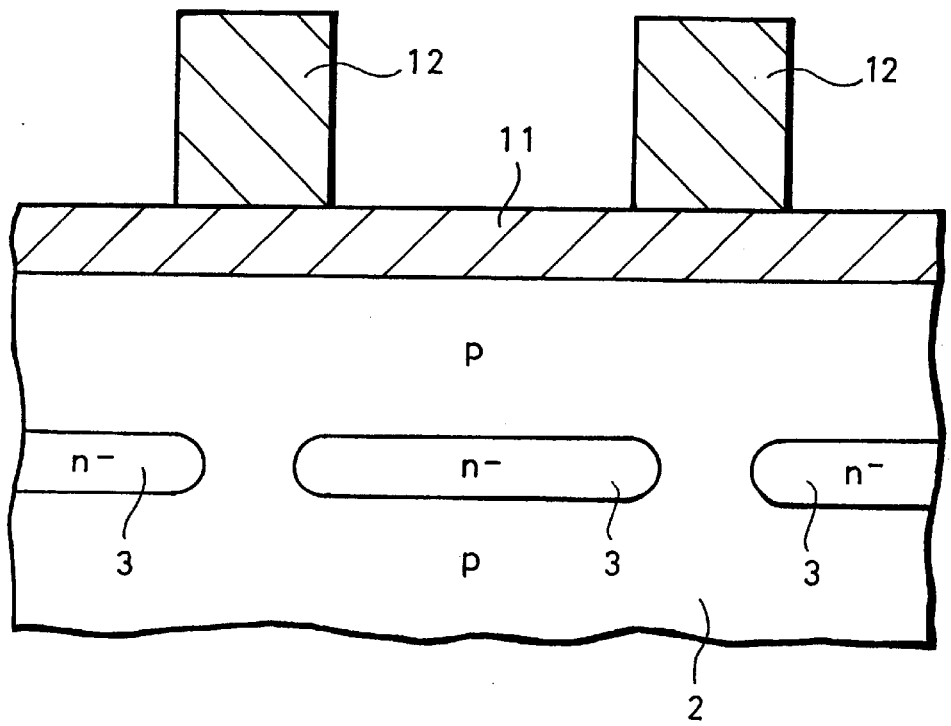

Then, as shown in FIG. 3B, with the photoresist 12 as a mask, an impurity such as P (phosphorus) or the like is ion-implanted in the neighborhood of a region of the semiconductor substrate 2 made of p-type silicon, which will become a source region 4 later, thereby to form a low-concentration (n−) buried layer 3 of a second conduction type, i.e., an n-type.

In the process, taking the impurity concentration of the semiconductor substrate 2 into consideration, the impurity concentration for ion implantation and the implantation energy are selected thereby to be able of forming the buried layer 3 at a predetermined depth.

Figure 3C:
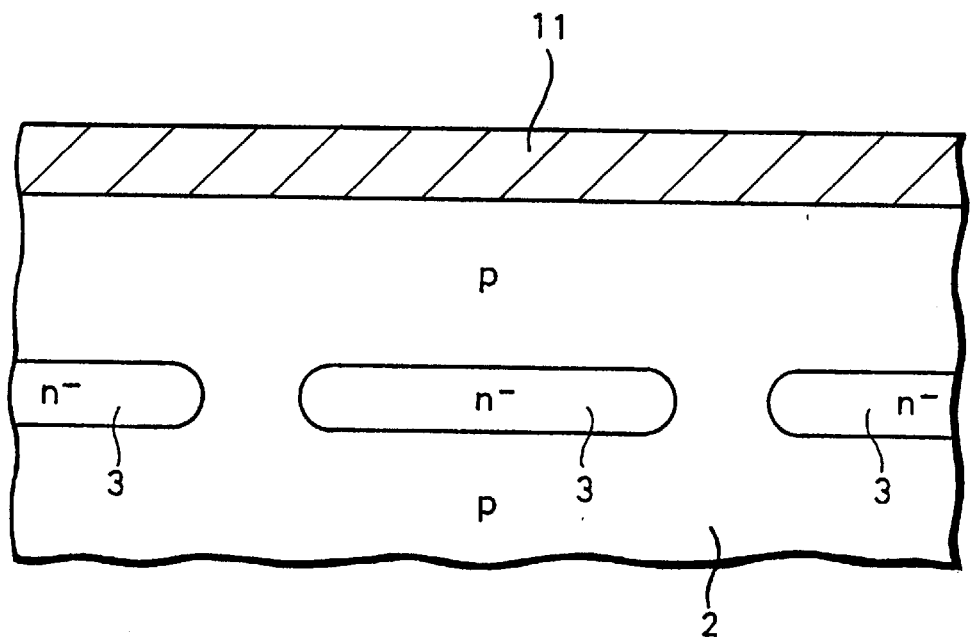

As the next step, as shown in FIG. 3C, after the photoresist 12 is removed, the impurity of the buried layer 3 is diffused by a heat treatment.

Figure 3D:
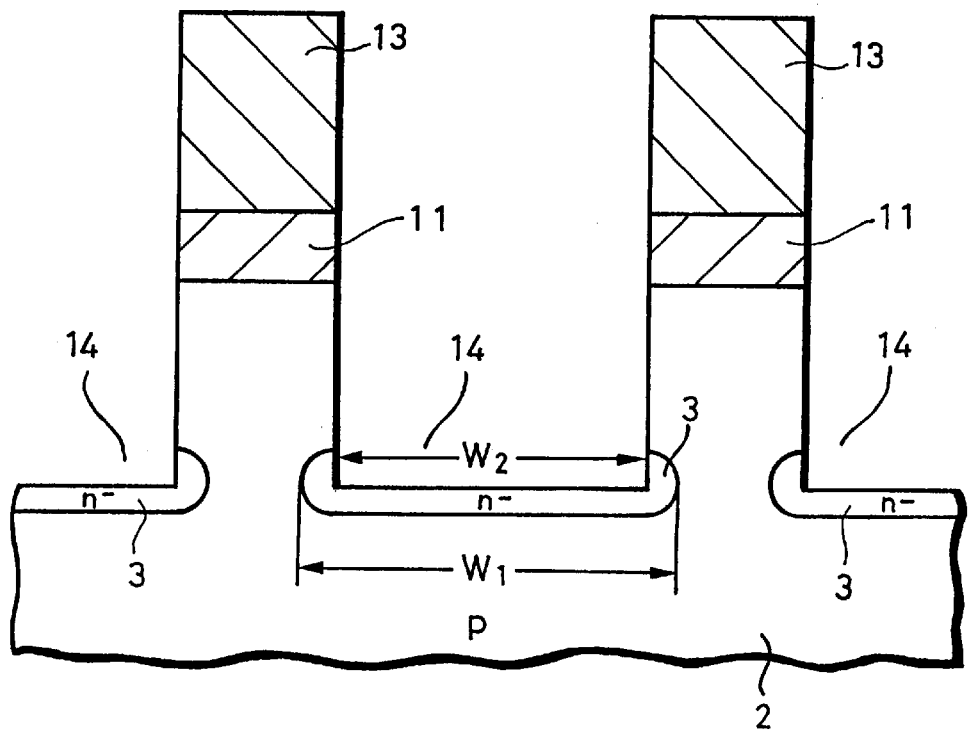

Then, a photoresist 13 is formed at the same position as the case of FIG. 3A, and using this as a mask, the insulating film 11 and the silicon substrate 2 are etched by an RIE (reactive ion etching) process or the like thereby to form a groove 14, as shown in FIG. 3D.

At the same time, a width $W_2$ of the groove 14 is set smaller than a width $W_1$ of the buried layer 3 into which the impurity is introduced, and the bottom of the groove (the recess of the semiconductor substrate) 14 is formed within the region of the buried layer 3.

Figure 3E:
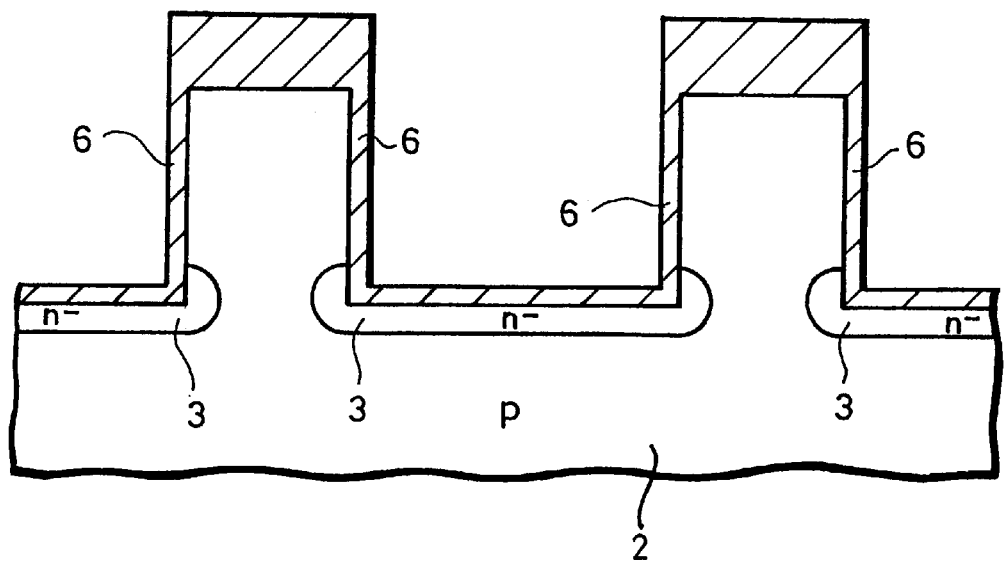

Next, as shown in FIG. 3E, the photoresist 13 is removed, and then a gate insulating film 6 is formed on the surface of the silicon substrate 2 by a thermal oxidation.

Figure 3F:
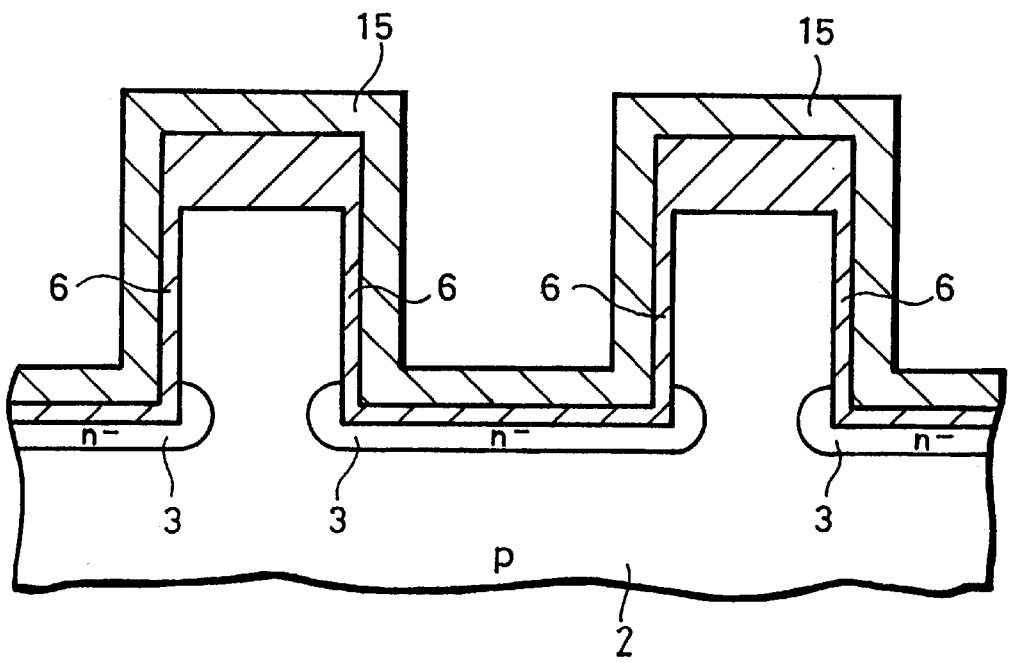

As the next step, as shown in FIG. 3F, a polysilicon layer 15 providing a gate electrode is deposited by the CVD method to cover the gate insulating film 6. In order to reduce the resistance, an impurity such as phosphorus or the like is introduced into the polysilicon layer 15.

Figure 3G:
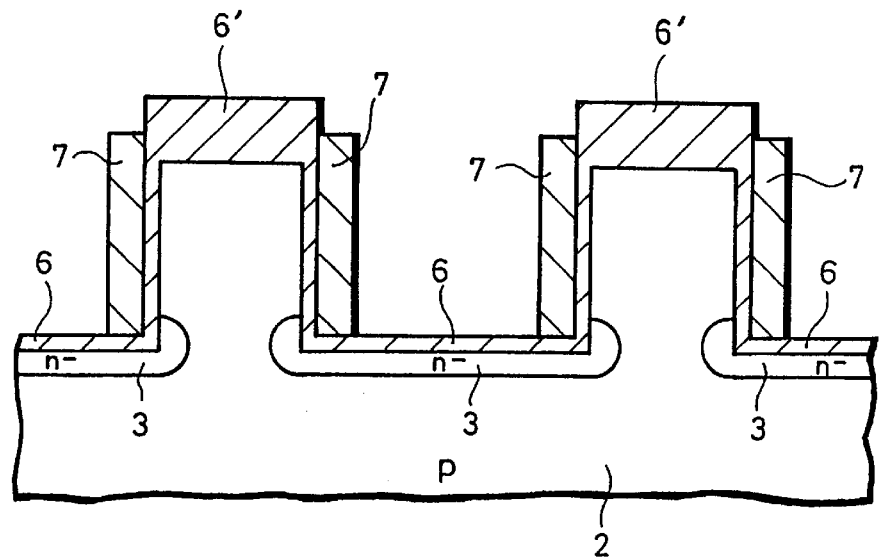

Then, as shown in FIG. 3G, the polysilicon layer 15 is etched away by the RIE (reactive ion etching) process or the like except for the side wall portion thereby to form a gate electrode 7.

Low-concentration ($1 \times 10^{13}$ to $5 \times 10^{14}$ cm$^2$) phosphorus is ion-implanted into the recess 2a and the protrusion 2b of the silicon substrate 2 to some depth with the implantation energy of 100 to 300 keV, followed by implanting high concentration ($1 \times 10^{15}$ to $1 \times 10^{16}$ cm$^2$) arsenic to a lesser depth with an implantation energy of 20 to 100 keV.

Figure 3H:
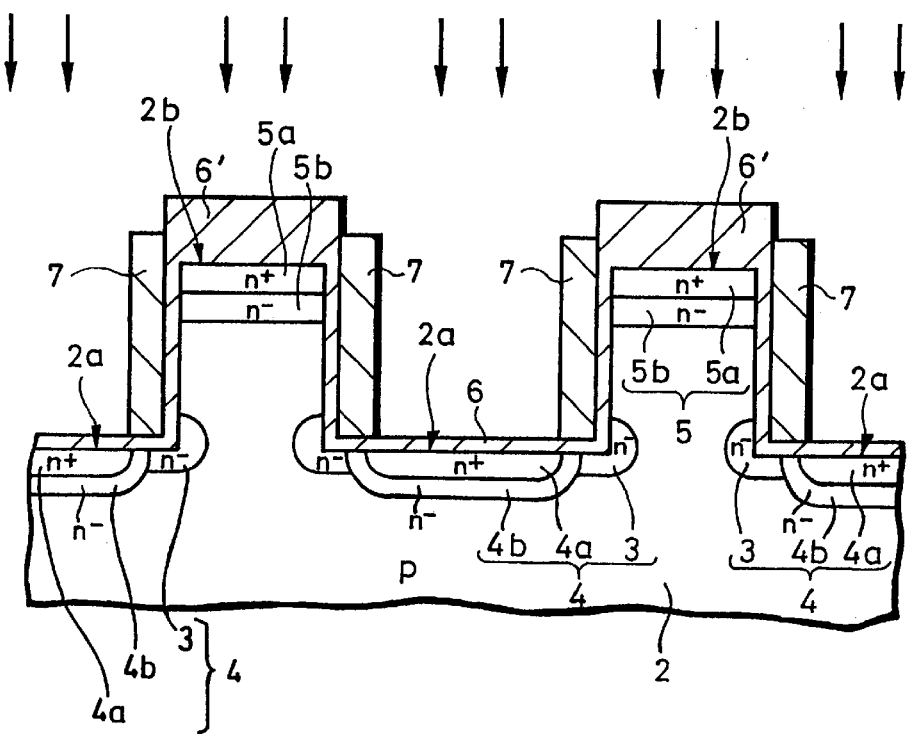

As a result, as shown in FIG. 3H, a high-concentration n+ region 4a and a low-concentration n− region 4b are formed in the recess 2a of the silicon substrate 2. Thus, at this portion an n-type source region 4 is formed of the high-concentration n+ region 4a, the low-concentration n− region 4b and the n− buried layer 3. At the same time, a high-concentration n+ region 5a and a low-concentration n− region 5b are formed in the protrusion 2b of the silicon substrate 2. Thus, at this portion an n-type drain region 5 is formed of the high-concentration n+ region 5a and the low-concentration n− region 5b.

Figure 3I:
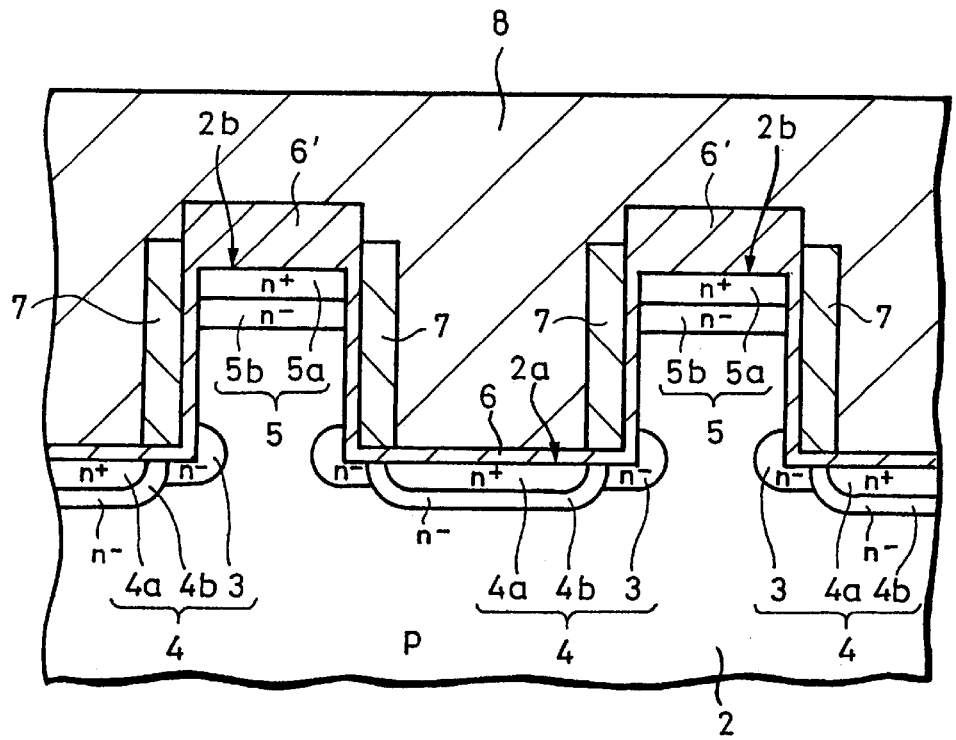

Then, as shown in FIG. 3I, the groove 14 is buried. A film made of BPSG (boron phosphorus silicate glass) or the like is formed to fill the groove 14 and to cover the entire surface. This BPSG film is then heat-treated to flow (flatten by fluidity) thereby forming an inter-layer insulating layer 8.

Figure 3J:
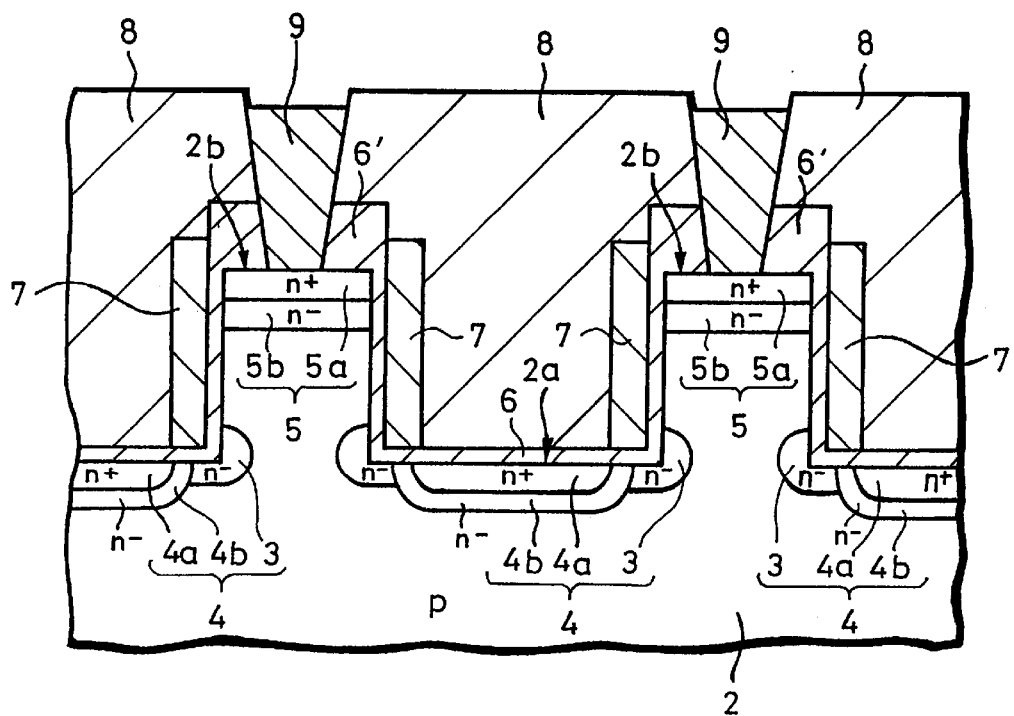

As shown in FIG. 3J, an opening (contact hole) reaching up from the surface of the protrusion 2b of the silicon substrate 2 formed with the high-concentration region 5a of the drain region 5 is formed in the inter-layer insulating layer 8. This opening is filled by forming therein a layer of tungsten or the like by the CVD method. The portion above the upper end of the opening is etched back by the RIE method thereby to form a plug contact 9 made of tungsten or the like material.

Then, an Al film is formed by sputtering on the plug contact 9 and worked into a predetermined shape thereby to form a metal wire 10 (see FIG. 2). In this way, the vertical MOS transistor 1 of a LDD structure shown in FIG. 2 is formed. Though not shown, the subsequent process includes the step of forming an overcoat film or the like, for example, on the surface.

FIG. 4 and FIGS. 5A to 5F show a vertical MOS transistor and its manufacturing method according to another embodiment.

In this embodiment, a side wall insulating film made of an insulating layer is formed on the lateral side of the surface insulating layer. With the insulating layer and the side wall insulating film wall as a mask, a groove is formed on the semiconductor substrate by an etching process.

Figure 4:
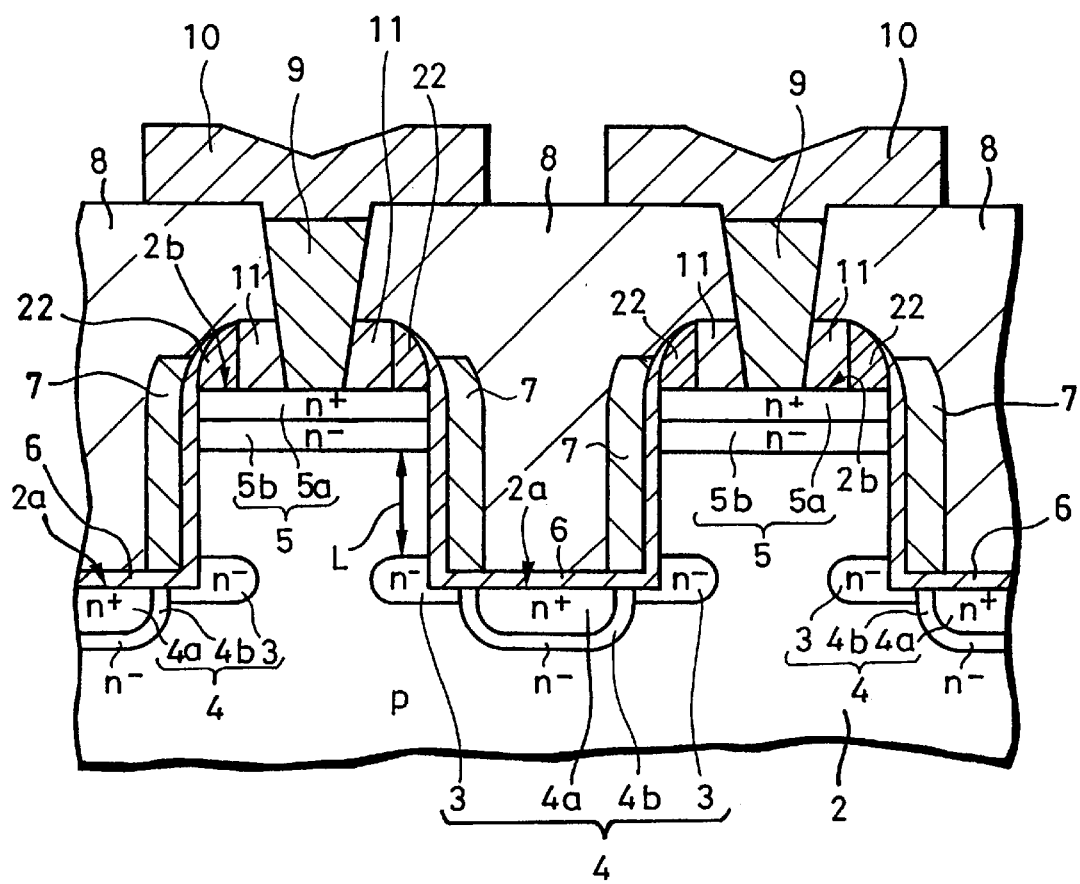
FIG. 4 is a cross sectional view schematically showing a configuration of a vertical field effect transistor (vertical MOS transistor) according to a second embodiment of the invention.

In a vertical MOS transistor 21 shown in FIG. 4, as compared with the vertical MOS transistor 1 shown in FIG. 2, the recess 2a of the semiconductor substrate 2 is formed using the insulating film 11 on the protrusion 2b of the semiconductor substrate 2 and a side wall insulating film 22 on the lateral side of the insulating film 11 as a mask.

Consequently, the protrusion 2b and the drain region 5 (5a, 5b) of the semiconductor substrate 2 are formed wider than the embodiment shown in FIG. 2, while the recess 2a and the source region 4 (4a, 4b) of the semiconductor substrate 2 are formed narrower than the embodiment shown in FIG. 2.

The arrangement of the remaining portions of the vertical MDS transistor 21 shown in FIG. 4 is made similar to that of the vertical MOS transistor 1 shown in FIG. 2 and therefore, with the same reference numerals attached to the corresponding parts, respectively, will not be described again.

In this case, too, the channel length L is defined by the distance between the drain region 5 and the buried layer 3, and the buried layer 3 is formed to substantially the constant depth by setting the ion implantation condition. Thus, even when any variation develops dependent on the groove, the channel length L remains the same in view of the fact that the groove is formed in such a manner that the bottom of the recess 2a of the semiconductor substrate 2 is located within the buried layer 3.

The result is that the characteristics of the vertical field effect transistor are free of variations.

This vertical MOS transistor 21 is manufactured in the manner described below.

Figure 5A:
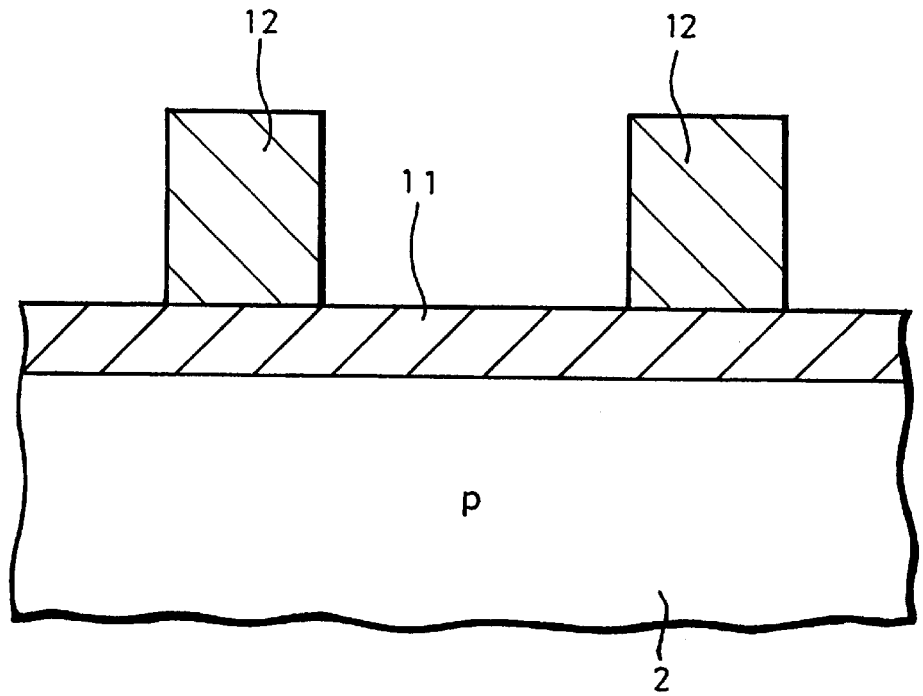
FIGS. 5A to 5F are cross sectional views used to explain the process steps for manufacturing the vertical MOS transistor shown in FIG. 4.

First, as shown in FIG. 5A, a semiconductor substrate 2 made of silicon of a first conduction type, say, a p-type is formed with an insulating film 11 by the thermal oxidation or the CVD (chemical vapor deposition) method. A photoresist 12 is formed on the insulating film 11 in such a manner as to form an opening in the portion thereof where a groove will be formed later.

Figure 5B:
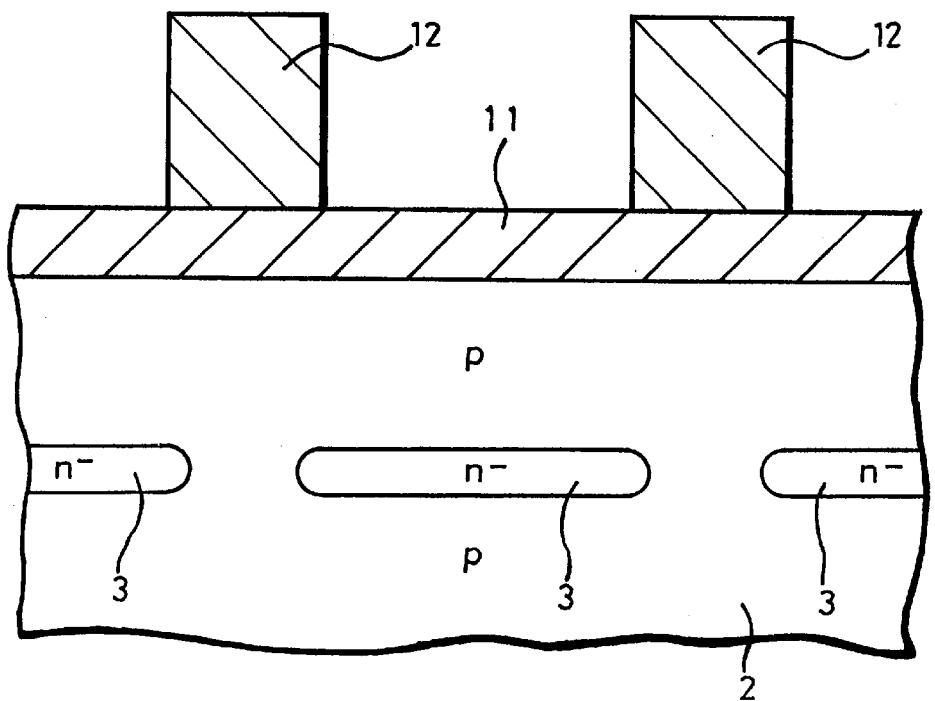

Then, as shown in FIG. 5B, with the photoresist 12 as a mask, an impurity such as phosphorus or the like is ion-implanted in a region to constitute a source region in the p-type silicon semiconductor substrate 2, thereby forming a low-concentration(n−) buried layer 3 of a second conduction type, say, an n-type.

Figure 5C:
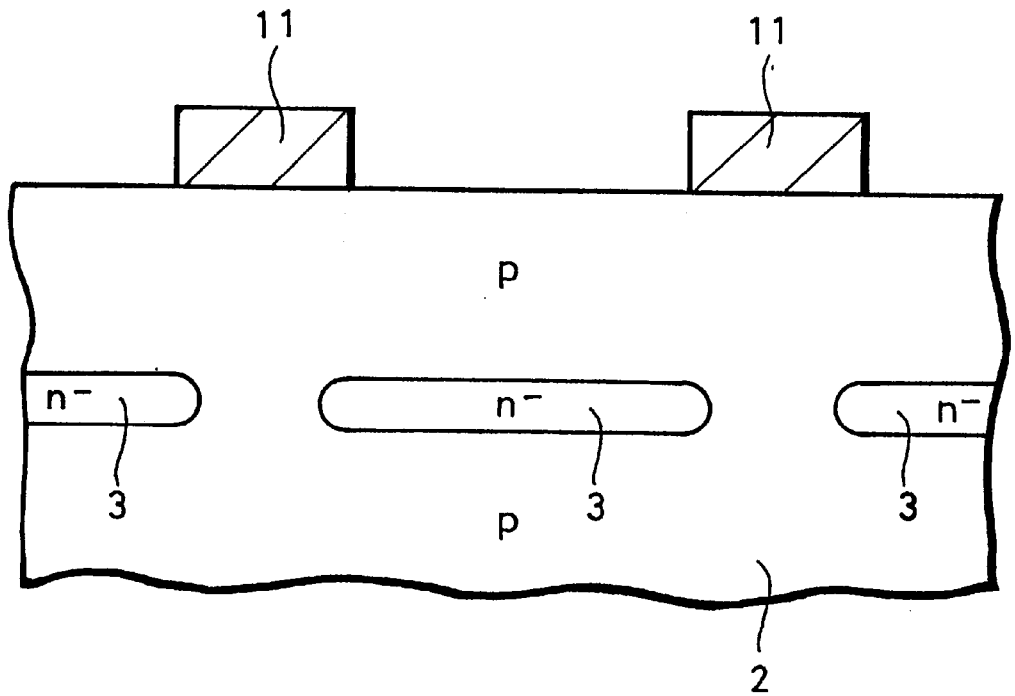

The next step is to etch away the insulating film 11 by the RIE method using the photoresist 12 as a mask as shown in FIG. 5C, after which the photoresist 12 is removed.

Figure 5D:
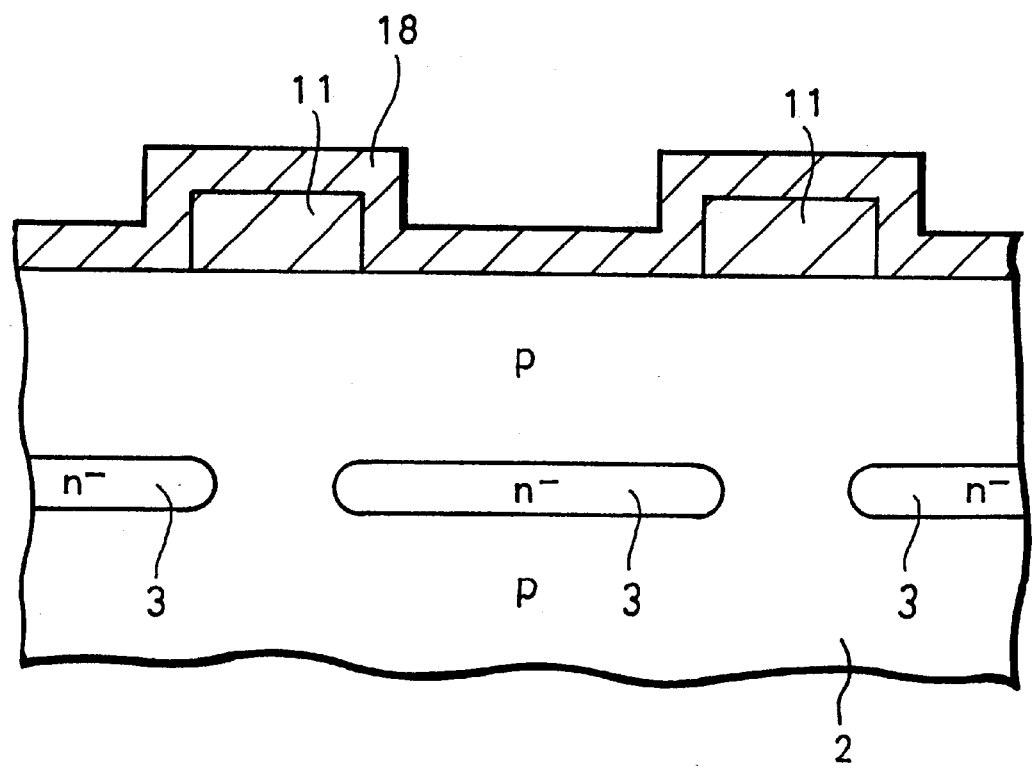

Then, as shown in FIG. 5D, an insulating oxide film 18 made of SiO$_2$ or the like is formed by the CVD process to cover the remaining portion of the insulating film 11.

Figure 5E:
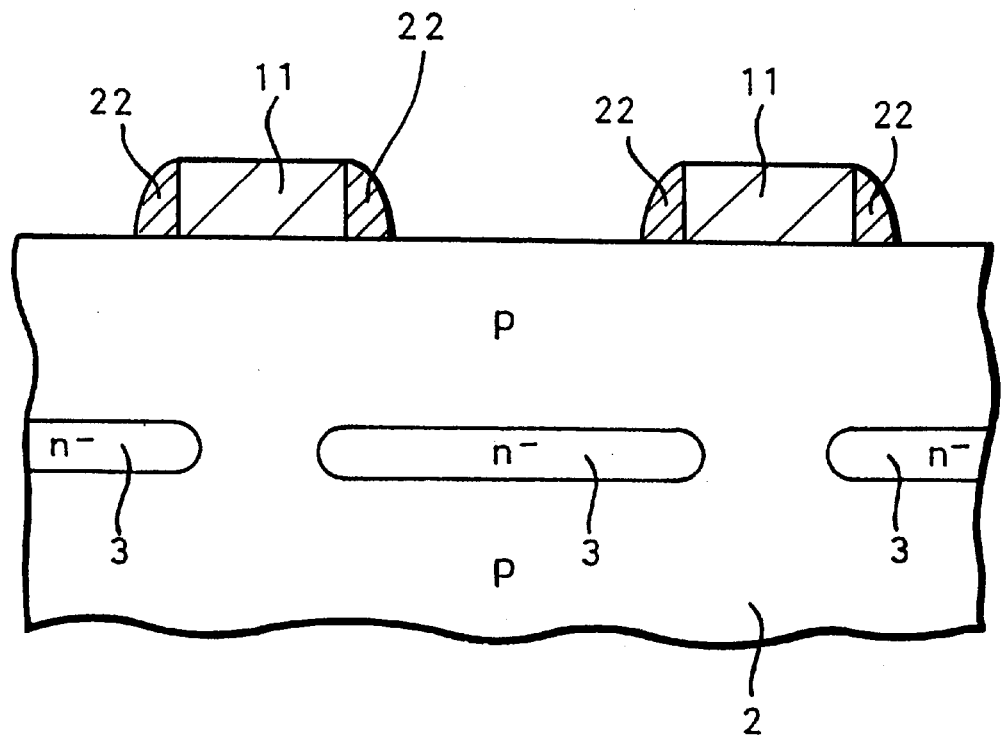

As shown in FIG. 5E, the insulating oxide film 18 is etched by the RIE method thereby to form a side wall insulating film 22 made of an insulating oxide film on the sides of the original insulating film 11.

Figure 5F:
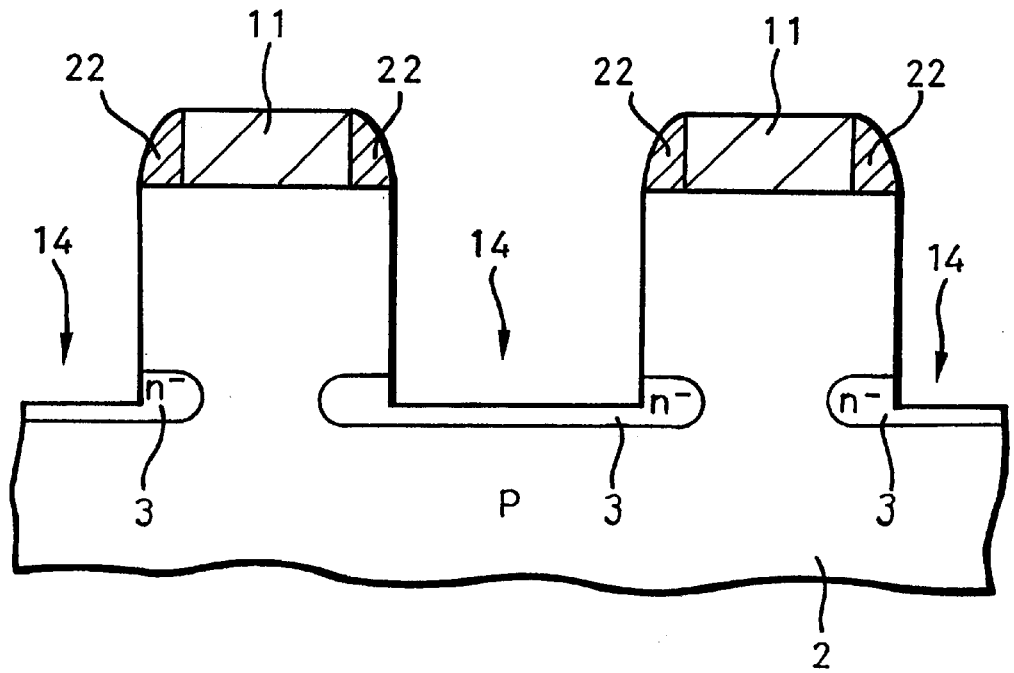

As shown in FIG. 5F, using the insulating film 11 and the side wall insulating film 22 as a mask, the semiconductor substrate 2 is etched by the RIE method thereby to form a groove 14.

In the process, as in the preceding embodiment, the bottom of the groove 14 is formed within the region of the buried layer 3 into which the impurity is introduced.

After that, like in the steps 3E to 3J described above, a gate electrode 7, a high-concentration region 4a and a low-concentration region 4b constituting a source region 4, a high-concentration region 5a and a low-concentration region 5b making up a drain region 5, an inter-layer insulating layer 8 and a metal electrode 10 are sequentially formed thereby to form the vertical MOS transistor 21 as shown in FIG. 4.

In the above-mentioned embodiments, the relative positions of the buried layer 3 and the groove 14 are liable to be displaced due to the displacement of the mask between the photoresist 12 of FIG. 3B and the photoresist 13 of FIG. 3D. According to this embodiment, in contrast, such a displacement between the buried layer 3 and the groove 14 is completely eliminated because after forming the buried layer 3, the insulating film 11 is patterned using the same photoresist 12 as a mask, thereby forming the side wall insulating film 22 and then the groove 14 is formed with the side wall insulating film 22 as a mask.

Although, unlike in the above-mentioned embodiments the gate electrode is formed of a single polysilicon layer, the vertical field effect transistor according to the present invention can be also applicable with equal effect to an apparatus (NV device, i.e., a non-volatile device) in which the gate is formed by double polysilicon layers formed through the inter-layer insulating layer. That example or third embodiment of the present invention is described below.

Figure 6:
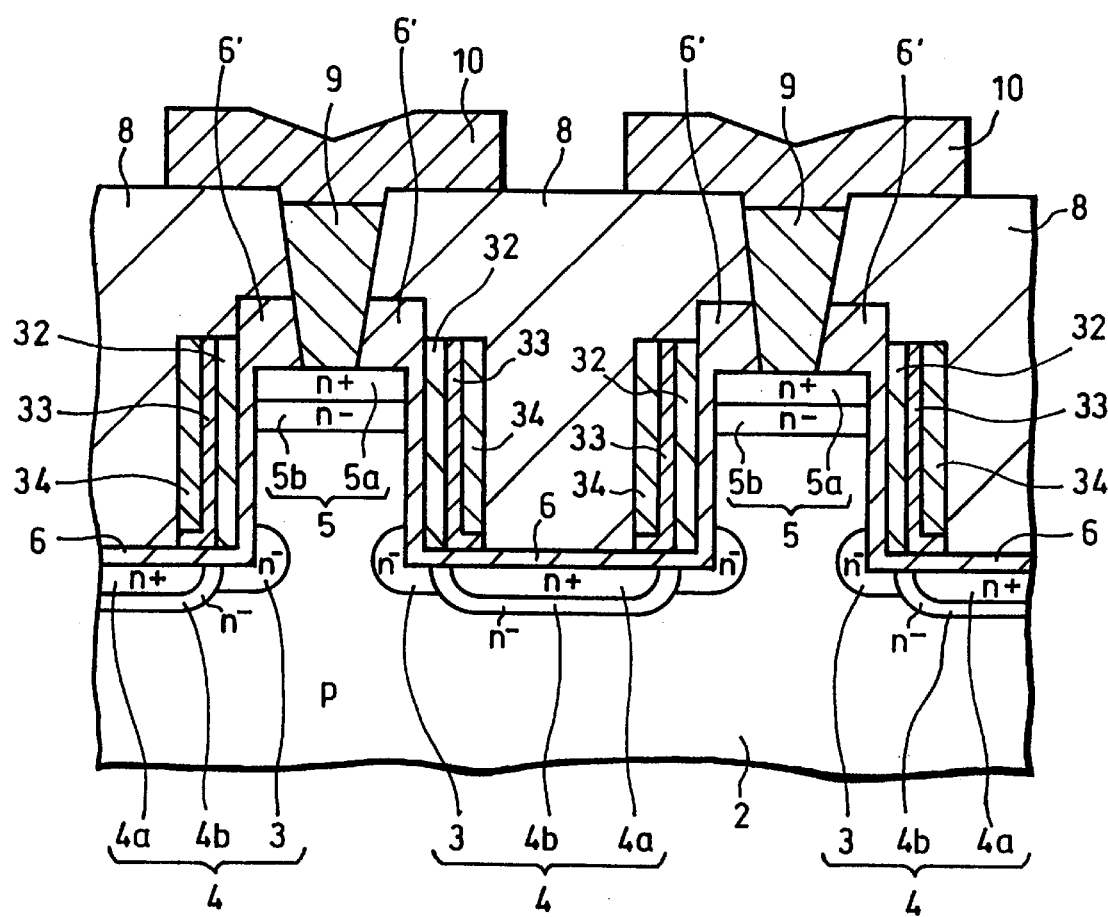
FIG. 6 is a cross sectional view schematically showing a configuration of a vertical field effect transistor according to a third embodiment of the invention.

A vertical field effect transistor 31 shown in FIG. 6 has the gate electrode thereof formed of a double polysilicon layer including a floating gate 32 and a control gate 34, and a second gate insulating layer 33 held between the gates 32, 34. This vertical field effect transistor 31 is applicable to an EPROM, a flush memory or the like.

The construction the other parts thereof is similar to that the corresponding parts of the vertical field effect transistor 1 shown in FIG. 2, and therefore will not be described again, with the same reference numerals attached thereto, respectively.

In this example, the source region 4 and the drain region 5 are formed after forming the floating gate 32 or after further forming the control gate 34.

In this case, too, like in the above-mentioned embodiments, variations in the depth of groove which may develop cause no variations in the channel length L. The characteristics of the apparatus as a memory, therefore, are not subjected to variations.

The vertical field effect transistor and the manufacturing method thereof according to the present invention are not confined to the above-mentioned embodiments, but can assume various other configurations without departing from the spirit and scope of the invention. Therefore, the scope of the present invention should be determined by the appended claims only.

What is claimed is:

1. A method of manufacturing a vertical field effect transistor, comprising in the following order the steps of:

forming separate buried layers of a second conduction type by ion implantation to a predetermined depth in a semiconductor substrate of a first conduction type;

forming a recess for each buried layer, each recess having a width smaller than the width of said buried layer and having the bottom thereof located within said buried layer of said semiconductor substrate and with adjacent recesses being separated by a protrusion;

forming a gate insulation film on the side walls of the protrusion;

forming a gate electrode on the gate insulating film on the side wall of the protrusion;

forming an impurity region making up a source and a drain on the surface of said protrusion and on the bottom surface of said recess;

providing an insulating layer to cover the protrusions and fill the recesses;

forming an opening in the insulating layer above each protrusion; and forming a plug contact in the opening contacting the upper surface of each protrusion.

2. A method of manufacturing a vertical field effect transistor according to claim 1, wherein said buried layer is thermally diffused after ion implantation.

3. A method according to claim 1, wherein the step of forming separate buried layers includes forming an insulating film layer on the semiconductor material before ion implantation and then forming a first mask on the insulating film layer for the ion implantation, and wherein the step of forming a recess includes etching portions of the insulating film layer using the first mask to form remaining portions, then removing the first mask, covering the remaining portions of the insulating film layer with an insulating oxide film, etching the insulating oxide film to form side wall films on the remaining portions and then using the remaining portions with the side wall films as a second mask when forming the recesses.

* * * * *